United States Patent
Ispas et al.

(10) Patent No.: US 11,346,884 B2
(45) Date of Patent: May 31, 2022

(54) SIGNAL ANALYSIS METHOD AND MEASUREMENT INSTRUMENT

(71) Applicant: Rohde & Schwarz GmbH & Co. KG, Munich (DE)

(72) Inventors: Adrian Ispas, Munich (DE); Julian Leyh, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 305 days.

(21) Appl. No.: 16/693,185

(22) Filed: Nov. 22, 2019

(65) Prior Publication Data

US 2021/0156915 A1    May 27, 2021

(51) Int. Cl.
*G01R 31/317*    (2006.01)

(52) U.S. Cl.
CPC ......... *G01R 31/31709* (2013.01); *G01R 31/31708* (2013.01); *G01R 31/31727* (2013.01)

(58) Field of Classification Search
CPC ........ G01R 31/31709; G01R 31/31708; G01R 31/31727; H04L 1/205; H04L 43/087; H03L 7/0807

See application file for complete search history.

(56) References Cited

U.S. PATENT DOCUMENTS

| | | | |
|---|---|---|---|
| 7,388,937 B1 * | 6/2008 | Rodger | H04L 1/205 375/346 |
| 2003/0004664 A1 * | 1/2003 | Ward | G01R 31/3171 702/69 |
| 2006/0251200 A1 | 11/2006 | Miller | |
| 2015/0035576 A1 * | 2/2015 | Romano | H03K 5/133 327/262 |

OTHER PUBLICATIONS

L. Moura and J. J. O'Reilly, "Performance assessment of signal jitter on clock recovery for high speed optical digital systems," 1994 IEEE GLOBECOM. Communications: The Global Bridge, San Francisco, CA, USA, 1994, pp. 1175-1179 vol. 2. (Year: 1994).*
N. Tanaka, H. Yoshida, M. Takahashi and Y. Takasaki, "Analyses of jitter suppression for digital transmission system with filter-less clock recovery," International Conference on Communication Technology Proceedings, 2003. ICCT 2003., Beijing, China, 2003, pp. 582-585 vol. 1. (Year: 2003).*

\* cited by examiner

*Primary Examiner* — Cynthia Britt
(74) *Attorney, Agent, or Firm* — Christensen O'Connor Johnson Kindness PLLC

(57) ABSTRACT

A signal analysis method is disclosed. The method comprises the following steps: An input signal comprising a symbol sequence is received, wherein the input signal is associated with a first clock signal comprising at least one jitter component. A second clock signal is recovered based on said input signal. At least one jitter parameter is determined that is associated with said at least one jitter component. A jitter signal is reconstructed based on said at least one jitter parameter, wherein said jitter signal is associated with said at least one jitter component. A third clock signal is determined based on said second clock signal and said jitter signal. Further, a measurement instrument is disclosed.

20 Claims, 4 Drawing Sheets

SIGNAL ANALYSIS METHOD AND MEASUREMENT INSTRUMENT

FIELD OF THE DISCLOSURE

Embodiments of the present disclosure generally relate to a signal analysis method. Embodiments of the present disclosure further relate to a measurement instrument.

BACKGROUND

Electromagnetic data signals are usually generated based on an internal clock signal that serves as a reference for timing signal edges and other signal changes correctly.

Such data signals commonly comprise two types of disturbances, namely jitter, i.e. deviations of the actual signal edge timings from planned signal edge timings, and noise, i.e. deviations of the actual signal levels from planned signal levels. In fact, the internal clock itself may be subject to such disturbances, particularly to jitter, with the result that these disturbances carry over to the generated data signal.

So far, signal analysis techniques are known that simply ignore the jitter of the internal clock or that consider the jitter of the internal clock only in the determination of a time interval error (TIE). However, this results in a suboptimal accuracy when analyzing properties of the data signal other than the TIE.

Thus, there is a need for a signal analysis method and a measurement instrument that provide a more precise treatment of disturbances of the internal clock of a device under test.

SUMMARY

Embodiments of the present disclosure provide a signal analysis method. In an embodiment, the method comprises the following steps: An input signal comprising a symbol sequence is received, wherein the input signal is associated with a first clock signal comprising at least one jitter component. A second clock signal is recovered based on said input signal. At least one jitter parameter is determined that is associated with said at least one jitter component. A jitter signal is reconstructed based on said at least one jitter parameter, wherein said jitter signal is associated with said at least one jitter component. A third clock signal is determined based on said second clock signal and said jitter signal.

The input signal is generated based on an underlying clock signal, namely the first clock signal, which comprises a temporal perturbation in form of the at least one jitter component.

However, the first clock signal cannot be measured directly as it is usually not transmitted together with the input signal.

Example methods according to the present disclosure are based on the idea to perform a clock recovery technique on the input signal, such that the second clock signal is obtained. The second clock signal, however, does not comprise the (periodic) jitter component of the first clock signal, as these (periodic) perturbations usually are averaged out during the clock recovery or are simply ignored. In general terms, these (periodic) perturbations are not comprised in the second clock signal obtained anymore.

Thus, additionally to the clock recovery, the jitter component itself is isolated by determining the jitter parameters and by reconstructing the jitter signal based on the jitter parameters.

Finally, the jitter signal and the second clock signal are added, thereby obtaining the third clock signal, which is an approximation to the first clock signal.

The third clock signal can then be used for further analysis of the input signal. For this further analysis, the at least one jitter component comprised in the first clock signal is correctly addressed due to the known third clock signal. Thus, the accuracy of the subsequent signal analysis is enhanced.

Therein and in the following, the term "the jitter parameters are determined" is understood to comprise the meanings "are estimated", "are roughly estimated" and "are calculated based on a mathematical model of the input signal".

Moreover, the term "reconstructed" is understood to also comprise the meaning "synthesized".

According to an aspect of the present disclosure, the received input signal is digitized, thereby generating a digitized input signal, and wherein the at least one jitter parameter is determined based on the digitized input signal. The digitized input signal is discrete in both time and amplitude. Thus, digital signal analysis techniques can be applied in order to determine the third clock signal.

In some embodiments, the second clock signal is recovered based on the digitized input signal.

According to another aspect, the at least one jitter parameter comprises a frequency of the at least one jitter component, a phase of the at least one jitter component and/or an amplitude of the at least one jitter component. There may be several jitter components present in the first clock signal. In this case, the at least one jitter parameter may comprise several amplitudes, frequencies and/or phases. For purely periodic jitter, these parameters are sufficient to fully characterize the periodic jitter component.

In an embodiment of the present disclosure, the at least one jitter parameter is associated with a periodic jitter component. Thus, the jitter component, or rather a time interval error caused by the jitter component, follows a curve that repeats after a certain time. This way, periodic perturbations in the first clock signal are correctly taken into account for a subsequent signal analysis of the input signal.

The symbol sequence may be determined based on the input signal. In other words, the input signal may be decoded, such that the respective values of the individual symbols are known. In some embodiments, the symbol sequence is determined based on the digitized input signal.

According to a further aspect of the present disclosure, a reconstructed input signal is determined based on the determined symbol sequence and/or the input signal. In some embodiments, the reconstructed input signal is determined based on both the determined symbol sequence and the input signal. In other words, the input signal is synthesized based on the determined symbol sequence and/or the input signal.

In some embodiments, a level difference between a reference level and the input signal and/or the reconstructed input signal is determined. A difference between the reference level and the actual amplitude level of the input signal and/or the reconstructed input signal corresponds to an amplitude perturbation, e.g., to noise. In other words, the jitter component comprised in the first clock signal is determined first and is then used in a subsequent noise analysis of the input signal.

According to another aspect of the present disclosure, the level difference is determined at a symbol time. In principle, the reference amplitude and the actual amplitude of the input signal and/or of the reconstructed can be compared at any time of interest within a symbol, wherein the individual symbol times are known due to the known third clock signal.

In a further embodiment of the present disclosure, the input signal is generated by a signal source, wherein a response function of the signal source is determined based on the third clock signal and the input signal. The input signal may be received via a transmission channel attached to the signal source. In that case, the response function is associated with both the signal source and the transmission channel.

Generally speaking, the term "response function" comprises all kinds of functions that describe the response of a device under test to an input signal. For example, the response function is one of the following: a step response, an impulse response, a frequency response, an amplitude response and/or a transfer function.

In some embodiments, the response function is a step response. The step response describes the behavior of a device under test in time domain.

According to another aspect of the present disclosure, the jitter signal is reconstructed based on the at least one jitter parameter and the second clock signal. For example, the jitter signal may be correctly temporally aligned based on the second clock signal.

According to another aspect of the present disclosure, the input signal is PAM-n coded, wherein n is an integer bigger than 1. Accordingly, the method is not limited to binary signals (PAM-2 coded) since any kind of pulse-amplitude modulated signals may be processed.

The at least one jitter parameter may be determined based on a mathematical model of the input signal. In other words, at least one function describing the at least one jitter component is modelled, wherein the at least one function comprises one or several jitter model parameters. The jitter parameters can then, for example, be determined by fitting the model to the actual data, i.e. to the actual input signal or rather the actual digitized input signal.

Embodiments of the present disclosure further provide a measurement instrument, comprising at least one input channel and an analysis module being connected to the at least one input channel. The measurement instrument is configured to receive an input signal via the input channel and to forward the input signal to the analysis module, wherein the input signal is associated with a first clock signal comprising at least one jitter component. The analysis module is configured to recover a second clock signal based on the input signal. The analysis module is configured to determine at least one jitter parameter that is associated with the at least one jitter component. The analysis module is configured to reconstruct a jitter signal based on the at least one jitter parameter, wherein the jitter signal is associated with the at least one jitter component. The analysis module is configured to determine a third clock signal based on the second clock signal and the jitter signal.

The measurement instrument according to the present disclosure is based on the idea to perform a clock recovery technique on the input signal, such that the second clock signal is obtained. The second clock signal, however, does not comprise the jitter component of the first clock signal, as these perturbations usually are averaged out during the clock recovery or are simply ignored.

Thus, additionally to the clock recovery, the jitter component itself is isolated by determining the jitter parameters and by reconstructing the jitter signal based on the jitter parameters. Finally, the jitter signal and the second clock signal are added, thereby obtaining the third clock signal, which is an approximation to the first clock signal.

The third clock signal can then be used for further analysis of the input signal. For this further analysis, the at least one jitter component comprised in the first clock signal is correctly addressed due to the known third clock signal. Thus, the accuracy of the measurement instrument for the subsequent signal analysis is enhanced.

In some embodiments, the measurement instrument is configured to perform the signal analysis method described above. Regarding the further advantages and properties of the measurement instrument, reference is made to the explanations given above regarding the signal analysis method, which also hold for the measurement instrument and vice versa.

The analysis module may comprise an analog-to-digital converter, the analog-to-digital converter being configured to digitize the input signal. The digitized input signal is discrete in both time and amplitude. Thus, digital signal analysis techniques can be applied by the analysis module in order to determine the third clock signal.

In some embodiments, the analysis module may be configured to recover the second clock signal based on the digitized input signal.

According to an aspect of the present disclosure, the analysis module is configured to determine at least one of a frequency of the at least one jitter component, a phase of the at least one jitter component and an amplitude of the at least one jitter component, namely a frequency of the at least one jitter component, a phase of the at least one jitter component and/or an amplitude of the at least one jitter component. There may be several jitter components present in the first clock signal. In this case, the at least one jitter parameter may comprise several amplitudes, frequencies and/or phases. For purely periodic jitter, these parameters are sufficient to fully characterize the periodic jitter component.

According to another aspect of the present disclosure, the analysis module is configured to determine the symbol sequence based on the input signal. In other words, the analysis module may be configured to decode the input signal, such that the respective values of the individual symbols are known. In some embodiments, the symbol sequence is determined by the analysis module based on the digitized input signal.

In a further embodiment of the present disclosure, the analysis module is configured to determine a reconstructed input signal based on at least one of the determined symbol sequence and the input signal, namely based on the determined symbol sequence and/or the input signal. In some embodiments, the reconstructed input signal is determined by the analysis module based on both the determined symbol sequence and the input signal. In other words, the input signal is synthesized based on the determined symbol sequence and/or the input signal.

In some embodiments, the analysis module is configured to determine a level difference between a reference level and at least one of the input signal and the reconstructed input signal, namely between the reference level and the input signal and/or the reconstructed input signal. A difference between the reference level and the actual amplitude level of the input signal and/or the reconstructed input signal corresponds to an amplitude perturbation, i.e. to noise. In other words, the analysis module is configured to determine the jitter component comprised in the first clock signal first and to then use the determined jitter component in a subsequent noise analysis of the input signal.

According to another aspect of the present disclosure, the analysis module is configured to determine a response function of a signal source based on the third clock signal and the input signal. The input signal may be received via a transmission channel attached to the signal source. In that case, the response function is associated with both the signal source and the transmission channel.

Generally speaking, the term "response function" comprises all kinds of functions that describe the response of a device under test to an input signal. For example, the response function is one of the following: a step response, an impulse response, a frequency response, an amplitude response and/or a transfer function.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
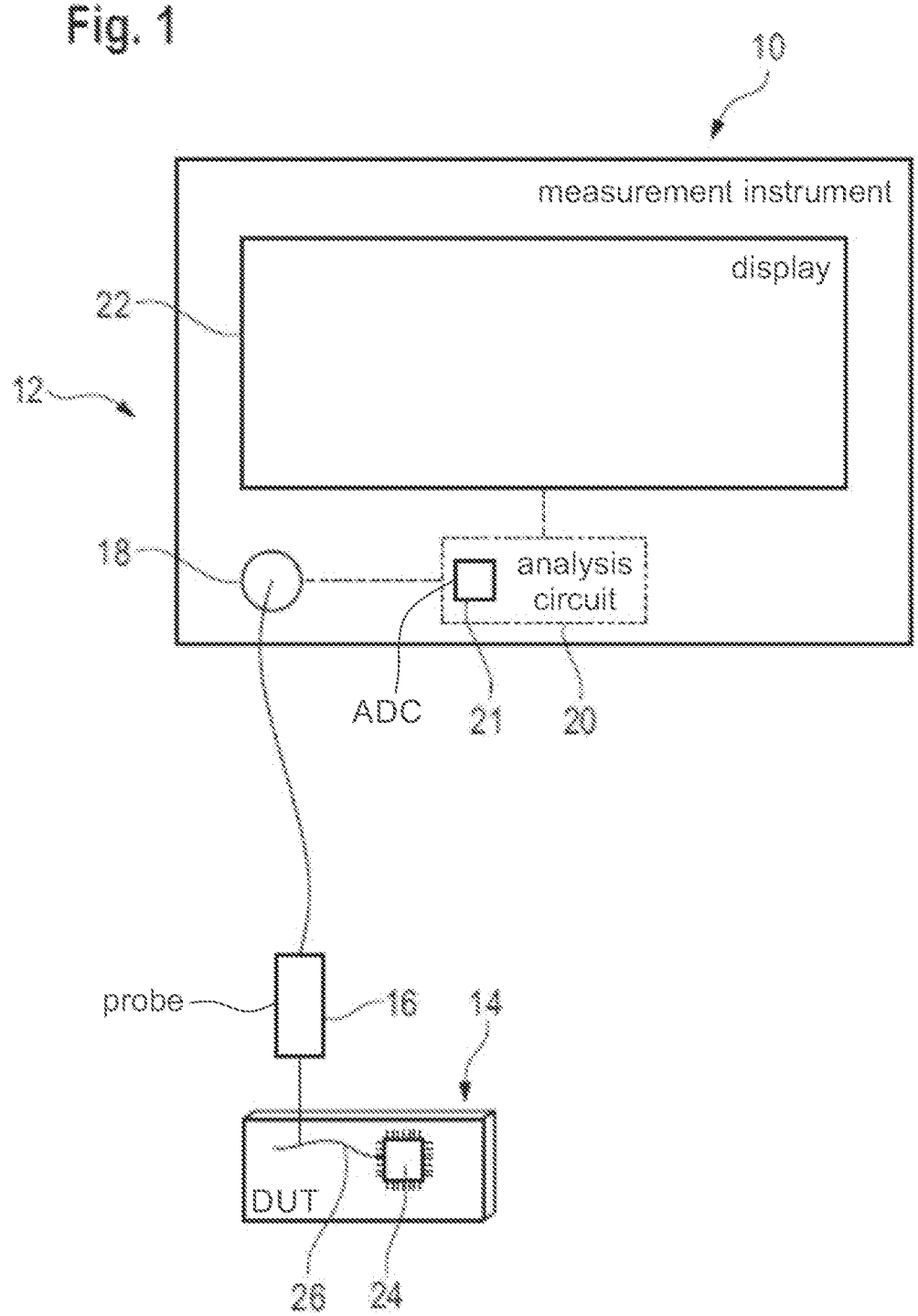
FIG. 1 shows a block diagram of a representative measurement system with an example measurement instrument according to the present disclosure.

FIG. 1 schematically shows a measurement system 10 comprising a measurement instrument 12 and a device under test 14. The measurement instrument 12 comprises a probe 16, an input channel 18, an analysis module 20 and a display 22. The probe 16 is connected to the input channel 18 which in turn is connected to the analysis module 20. The display 22 is connected to the analysis module 20 and/or to the input channel 18 directly. Typically, a housing is provided that encompasses at least the analysis module 20 comprising an analog-to-digital converter 21.

Generally, the measurement instrument 12 may comprise an oscilloscope, a spectrum analyzer, a vector network analyzer or any other kind of measurement device being configured to measure certain properties of the device under test 14.

The device under test 14 comprises a signal source 24 as well as a transmission channel 26 connected to the signal source 24. In general, the signal source 24 is configured to generate an electrical signal based on a first clock signal, wherein the electrical signal propagates via the transmission channel 26. In particular, the device under test 14 comprises a signal sink to which the signal generated by the signal source 24 propagates via the transmission channel 26.

Generally speaking, the first clock signal serves as an internal clock of the device under test 14, i.e. as a reference for timing signal edges and other signal changes of the electrical signal correctly More specifically, the signal source 24 generates the electrical signal that is then transmitted via the transmission channel 26 and probed by the probe 16, for example a tip of the probe 16. The electrical signal generated by the signal source 24 is forwarded via the transmission channel 26 to a location where the probe 16, for example its tip, can contact the device under test 14 in order to measure the input signal.

Thus, the electrical signal may generally be sensed between the signal source 24 and the signal sink assigned to the signal source 24, wherein the electrical signal may also be probed at the signal source 24 or the signal sink directly.

Put another way, the measurement instrument 12, for example the analysis module 20, receives an input signal via the probe 16 that senses the electrical signal.

The input signal probed is forwarded to the analysis module 20 via the input channel 18. The input signal is then processed and/or analyzed by the analysis module 20 in order to determine said properties of the device under test 14. As will be described in more detail below, the analysis module 20 can be established by hardware circuitry, or software, or a combination of software and hardware circuitry.

Therein and in the following, the term "input signal" is understood to be a collective term for all stages of the signal generated by the signal source 24 that exist before the signal reaches the analysis module 20. In other words, the input signal may be altered by the transmission channel 26 and/or by other components of the device under test 14 and/or of the measurement instrument 12 that process the input signal before it reaches the analysis module 20. Accordingly, the input signal relates to the signal that is received and analyzed by the analysis module 20.

The input signal usually contains perturbations in the form of total jitter (TJ) that is a perturbation in time and total noise (TN) that is a perturbation in amplitude. The total jitter and the total noise in turn each comprise several components.

Figure 2:
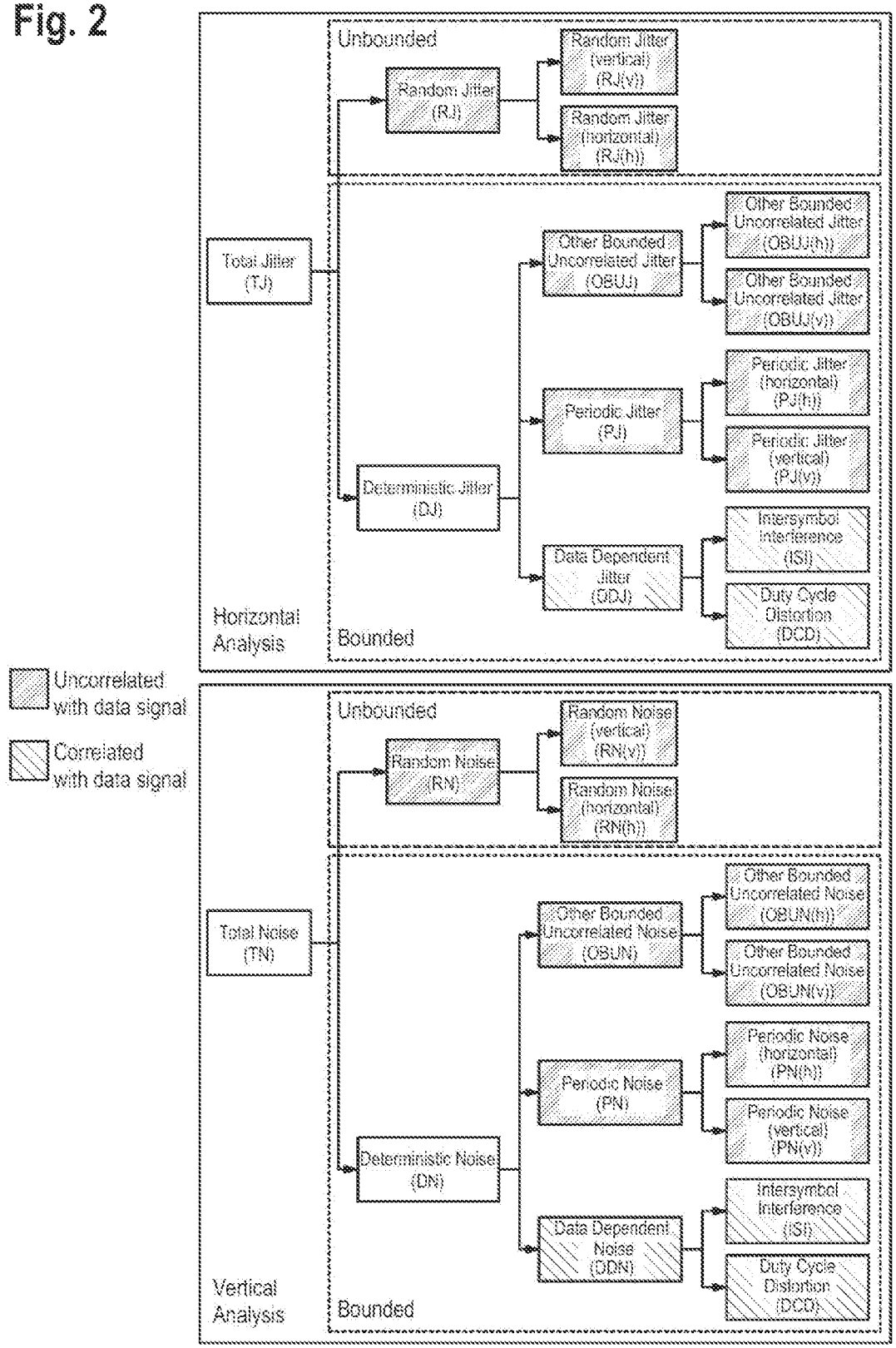
FIG. 2 shows a tree diagram of different types of jitter and different types of noise.

As is shown in FIG. 2, the total jitter (TJ) is composed of random jitter (RJ) and deterministic jitter (DJ), wherein the random jitter (RJ) is unbounded and randomly distributed, and wherein the deterministic jitter (DJ) is bounded.

The deterministic jitter (DJ) itself comprises data dependent jitter (DDJ), periodic jitter (PJ) and other bounded uncorrelated jitter (OBUJ).

The data dependent jitter is directly correlated with the input signal, in particular directly correlated with signal edges in said input signal. The periodic jitter is uncorrelated with the input signal and comprises perturbations that are periodic, for example in time. The other bounded uncorrelated jitter comprises all deterministic perturbations that are neither correlated with the input signal nor periodic. The data dependent jitter comprises up to two components, namely inter-symbol interference (ISI) and duty cycle distortion (DCD).

Analogously, the total noise (TN) comprises random noise (RN) and deterministic noise (DN), wherein the deterministic noise contains data dependent noise (DDN), periodic noise (PN) and other bounded uncorrelated noise (OBUN).

Similarly to the jitter, the data dependent noise is directly correlated with the input signal, in particular directly correlated with signal edges in said input signal. The periodic noise is uncorrelated with the input signal and comprises perturbations that are periodic, for example in amplitude. The other bounded uncorrelated noise comprises all deterministic perturbations that are neither correlated with the input signal nor periodic. The data dependent noise comprises up to two components, namely inter-symbol interference (ISI) and duty cycle distortion (DCD).

In general, there is cross-talk between the perturbations in time and the perturbations in amplitude.

Put another way, jitter may be caused by "horizontal" temporal perturbations, which is denoted by "(h)" in FIG. 2 and in the following, and/or by "vertical" amplitude perturbations, which is denoted by a "(v)" in FIG. 2 and in the following.

Likewise, noise may be caused by "horizontal" temporal perturbations, which is denoted by "(h)" in FIG. 2 and in the following, and/or by "vertical" amplitude perturbations, which is denoted by a "(v)" in FIG. 2 and in the following.

In fact, not only the input signal itself may comprise jitter, but also the first clock signal may comprise a jitter component.

Figure 3:
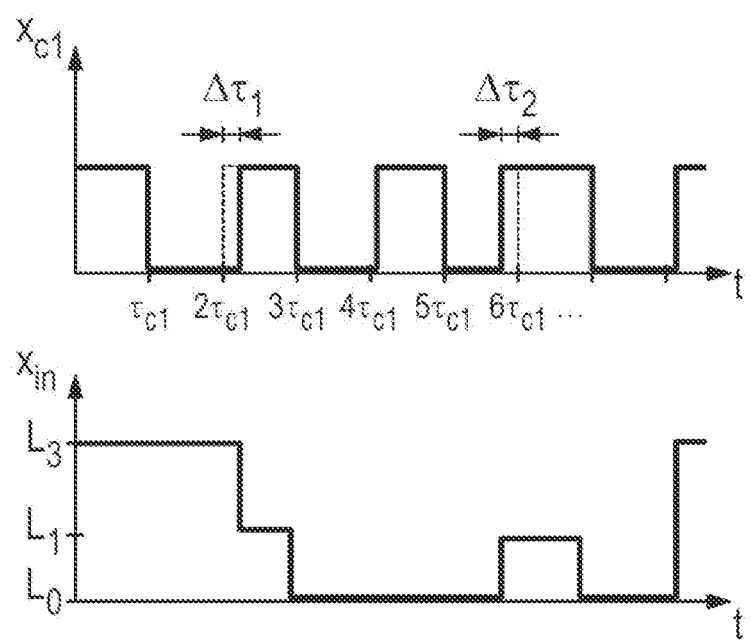
FIG. 3 shows a diagram of an example input signal as well as an example first clock signal plotted against time.

This is illustrated in FIG. 3, which shows a respective plot of the input signal $x_{in}(t)$ as well as of the first clock signal $x_{c1}(t)$ against time. The input signal is a PAM-n coded signal, wherein n is an integer bigger than 1.

The input signal comprises a symbol sequence, wherein the value of each symbol is determined by the respective amplitude level of the input signal. In fact, there are n different possible amplitude levels for a PAM-n coded signal. In FIG. 3, there are three possible amplitude levels $L_1$, $L_2$ and $L_3$.

The upper portion of FIG. 3 shows the timing deviation of the first clock signal due to the jitter component. The first clock signal has a desired clock period $\tau_{c1}$, such that the edges of the first clock signal should be at integer multiples of $\tau_{c1}$. However, due to the jitter component, deviations $\Delta\tau_i$ of the signal edge timings occur.

Generally speaking, the analysis module 20 is configured to analyze the input signal and/or the symbol sequence comprised in the input signal in order to test properties of the device under test 14.

Therein, the disturbances of the input signal, for example the jitter component comprised in the first clock signal, may impair the precision of the measurements.

In principle, all types of jitter described above with reference to FIG. 2 can cause these timing deviations. However, one particularly relevant jitter type for the internal clocks is the horizontal periodic jitter, i.e. jitter that is caused by temporal perturbations.

Figure 4:
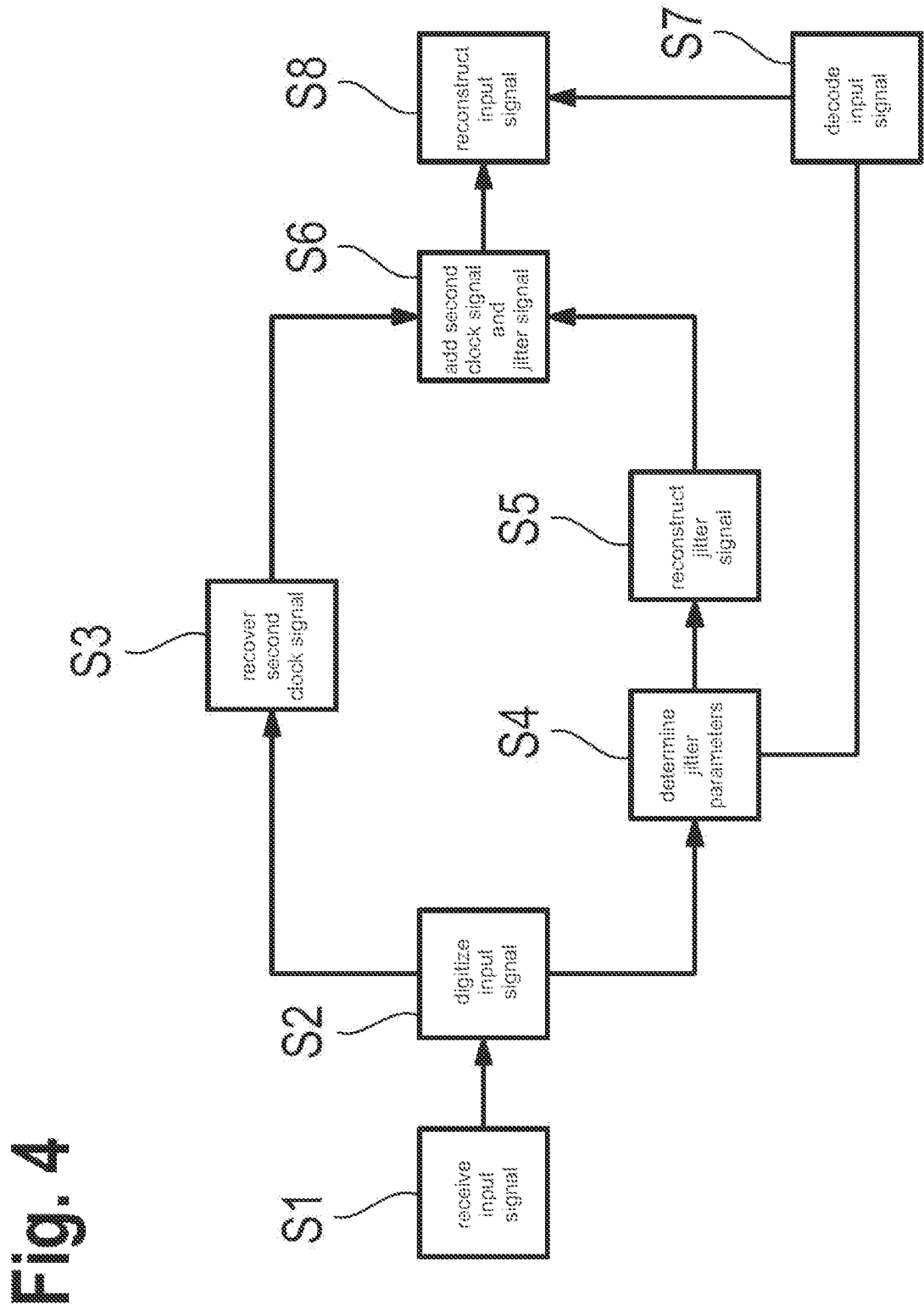
FIG. 4 shows a flow chart of an example signal analysis method according to the present disclosure.

Thus, the measurement instrument 12, or rather the analysis module 20 is configured to perform a signal analysis method described in the following with reference to FIG. 4.

The input signal is received via the input channel 18 and forwarded to the analysis module 20 (step S1).

The input signal is digitized by the analog-to-digital converter 21, thereby generating a digitized input signal (step S2).

A clock recovery technique is applied to the digitized input signal, such that a second clock signal is recovered based on the digitized input signal (step S3).

In step S3, any suitable clock recovery technique known in the state of the art can be applied.

The second clock signal is similar to the first clock signal. However, the second clock signal does not comprise the jitter component of the first clock signal, as these perturbations usually are averaged out during the clock recovery or are simply ignored.

The result of step S3 may be generated in the form of a vector $(t_1, t_2, \ldots, t_N)$, wherein the $t_i$ are the times at which signal edges of the second clock signal are located. Therein, N is the total number of samples.

Moreover, relevant jitter parameters of the jitter component comprised in the first clock signal are determined based on the input signal, more precisely based on the digitized input signal (step S4).

In some embodiments, jitter parameters associated with horizontal jitter are determined, for example with horizontal periodic jitter.

Therein and in the following, the term "the jitter parameters are determined" is understood to comprise the meanings "are estimated", "are roughly estimated" and "are calculated based on a mathematical model of the input signal".

More precisely, a frequency of said jitter component, an amplitude of said jitter component and/or a phase of the jitter component are determined in step S4.

The jitter parameters may be determined by modelling the input signal or rather the digitized input signal, as well as the jitter with a mathematical model For example, the input signal may be modelled as $$x_{in}(t/T_b) = \sum_{k=-N_{pre}}^{N_{post}} b(k) \cdot h(t/T_b - k - \varepsilon(k)/T_b) + pert., \quad (E.\ 1)$$

wherein "pert." denotes further perturbations that may or may not be incorporated into the mathematical model.

b(k) represents a bit sequence sent by the signal source 24 via the transmission channel 26, wherein $T_b$ is the bit period.

Note that strictly speaking the term "bit" is only correct for a PAM-2 coded input signal. However, the term "bit" is to be understood to also include a corresponding signal symbol of the PAM-n coded input signal for arbitrary integer n.

$h(t/T_b)$ is the joint impulse response of the signal source 24 and the transmission channel 26. In case of directly probing the signal source 24, $h(t/T_b)$ is the impulse response of the signal source 24 since no transmission channel 26 is provided or rather necessary.

Note that the joint impulse response $h(t/T_b)$ does not comprise contributions that are caused by the probe 16, as these contributions are usually compensated by the measurement instrument 12 or the probe 16 itself in a process called "de-embedding". Moreover, contributions from the probe 16 to the joint impulse response $h(t/T_b)$ may be negligible compared to contributions from the signal source 24 and the transmission channel 26.

$N_{pre}$ and $N_{post}$ respectively represent the number of bits before and after the current bit that perturb the input signal due to inter-symbol interference. As already mentioned, the length $N_{pre}+N_{post}+1$ may comprise several bits, for example several hundred bits, especially in case of occurring reflections in the transmission channel 26.

Further, $\varepsilon(k)$ is a function describing the time perturbation, i.e. $\varepsilon(k)$ represents the temporal jitter.

The function $\varepsilon(k)$ describing the temporal jitter is modelled as follows:

$$\varepsilon(k)/T_b = \sum_{i=0}^{N_{PJ(h)}-1} a_i/T_b \cdot \sin(2\pi \cdot \vartheta_i / f_b \cdot k + \varphi_i) + \varepsilon_{RJ}(k)/T_b + \varepsilon_{OBUJ}(k)/T_b. \quad (E.\ 2)$$

The first term in equation (E.2), namely $$\sum_{i=0}^{N_{PJ(h)}-1} a_i / T_b \cdot \sin(2\pi \cdot \vartheta_i / f_b \cdot k + \varphi_i),$$

represents the periodic jitter components that are modelled by a series over $N_{PJ(h)}$ sine-functions with respective amplitudes $a_i$, frequencies $\vartheta_i$ and phases $\varphi_i$, which is equivalent to a Fourier series of the horizontal periodic jitter.

The amplitudes $a_i$, frequencies $\vartheta_i$ and phases $\varphi_i$ may, for example, be determined by matching the model of equations (E.1) and (E.2) to the digitized input signal.

Based on the determined jitter parameters, a jitter signal is reconstructed (step S5). Generally speaking, the jitter signal comprises the information for each one of the signal edges in the first clock signal, how much the respective signal edge is shifted due to the jitter, for example due to the horizontal periodic jitter.

Therein and in the following, the term "reconstructed" is understood to also comprise the meaning "synthesized".

For example, the mathematical model of equations (E.1) and (E.2) may be employed in order to reconstruct the jitter signal.

The result of step S5 may be generated in the form of a vector $(\Delta t_1, \Delta t_2, \ldots, \Delta t_N)$, wherein the $\Delta t_i$ are the respective time deviations of the signal edges of the first clock signal.

The second clock signal and the reconstructed jitter signal are then added, such that a third clock signal is obtained (step S6). The third clock signal approximately is equal to the first clock signal.

The result of step S6 may be generated in the form of a vector $(t_1+\Delta t_1, t_2+\Delta t_2, \ldots, t_N \Delta t_N)$.

As already explained above, the second clock signal does not comprise the perturbations comprised in the first clock signal. These perturbations are reconstructed by determining the jitter parameters and subsequently reconstructing the jitter signal based on the jitter parameters. By adding the second clock signal and the jitter signal, an approximation to the first clock signal is obtained.

The third clock signal can then be used in further analysis stages in the analysis of the input signal. Thus, the jitter comprised in the first clock signal is known for the further analysis stages and can be correctly accounted for.

The analysis module 20 may further decode the input signal or rather the digitized input signal after the second clock signal has been determined (step S7).

Based on the recovered second clock signal, the input signal is divided into the individual symbol intervals and the values of the individual symbols ("bits") b(k) are determined.

The signal edges are assigned to respective symbol intervals due to their times, namely the times $t_{edge}(i)$ of signal edges. Usually, only one signal edge appears per symbol interval.

In other words, the input signal is decoded by the analysis module 20, thereby generating a decoded input signal. Thus, b(k) represents the decoded input signal.

The step of decoding the input signal may be skipped if the input signal comprises an already known bit sequence. For example, the input signal may be a standardized signal such as a test signal that is determined by a communication protocol. In this case, the input signal does not need to be decoded, as the bit sequence contained in the input signal is already known.

Based on the decoded input signal and based on the determined third clock signal, a reconstructed input signal can be determined (step S8).

For this purpose, the mathematical model of equations (E.1) and (E.2) may be employed. In other words, the reconstructed input signal is based on the quantities determined as described above, namely the third clock signal and the jitter parameters or rather the reconstructed jitter signal.

Alternatively or additionally, a response function of the device under test 14 or rather a combined response function of the signal source 24 and the transmission channel may be determined based on the third clock signal and/or based on the decoded input signal.

In some embodiments, the combined step response and/or the combined impulse response of the signal source 24 and the transmission channel 26 may be determined.

For example, the step response and/or the impulse response are determined by fitting the model of equations (E.1) and (E.2) to the reconstructed input signal and/or the input signal or rather the digitized input signal.

Alternatively or additionally, a level difference between a reference level and an amplitude level of the input signal and/or the reconstructed input signal is determined.

Therein, the reference level is the expected level of the input signal for the current symbol value of the input signal or rather the digitized input signal. A difference between the reference level and the actual amplitude level of the input signal and/or the reconstructed input signal corresponds to an amplitude perturbation, i.e. to noise.

In other words, the jitter component comprised in the first clock signal is determined first and is then used in a subsequent noise analysis of the input signal.

In principle, the reference amplitude and the actual amplitude of the input signal and/or of the reconstructed can be compared at any time of interest within a symbol, wherein the individual symbol times are known due to the known third clock signal.

The analysis module 20 or other components of the system described herein may include, in some embodiments, logic for implementing the technologies and methodologies described herein. This logic of these components can be carried out in either hardware or software, or a combination of hardware and software. In some embodiments, one or more of these components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, one or more of these components includes a microprocessor and a memory storing logic modules and/or instructions. In an embodiment, one or more of these components includes one or more ASICs having a plurality of predefined logic components. In an embodiment, one or more of these components includes one or more FPGA having a plurality of programmable logic components. In an embodiment, one or more of these components includes hardware circuit implementations (e.g., implementations in analog circuitry, implementations in digital circuitry, and the like, and combinations thereof). In an embodiment, one or more of these components includes combinations of circuits and computer program products having software or firmware instructions stored on one or more computer readable memories that work together to cause a device to perform one or more methodologies or technologies described herein.

In some embodiments, the analysis module and/or the measurement instrument includes analysis circuit(s) configured to carry out the methods of Claims 1-13. In some embodiments, the analysis module and/or the measurement instrument includes analysis circuit(s) programmed to implement the methods of Claims 1-13.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method, comprising the following steps:
   receiving an input signal comprising a symbol sequence, wherein the input signal is associated with a first clock signal comprising at least one jitter component;
   recovering a second clock signal based on said input signal;
   determining at least one jitter parameter that is associated with said at least one jitter component;
   reconstructing a jitter signal based on said at least one jitter parameter, wherein said jitter signal is associated with said at least one jitter component; and
   determining a third clock signal based on said second clock signal and said jitter signal.

2. The method of claim 1, wherein said received input signal is digitized, thereby generating a digitized input signal, and wherein said at least one jitter parameter is determined based on said digitized input signal.

3. The method of claim 1, wherein said at least one jitter parameter comprises at least one of a frequency of said at least one jitter component, a phase of said at least one jitter component and an amplitude of said at least one jitter component.

4. The method of claim 1, wherein said at least one jitter parameter is associated with a periodic jitter component.

5. The method of claim 1, wherein said symbol sequence is determined based on the input signal.

6. The method of claim 5, wherein a reconstructed input signal is determined based on at least one of the determined symbol sequence and said input signal.

7. The method of claim 1, wherein a level difference between a reference level and at least one of said input signal and said reconstructed input signal is determined.

8. The method of claim 7, wherein said level difference is determined at a symbol time.

9. The method of claim 1, wherein the input signal is generated by a signal source, and wherein a response function of said signal source is determined based on said third clock signal and said input signal.

10. The method of claim 9, wherein said response function is a step response.

11. The method of claim 1, wherein said jitter signal is reconstructed based on said at least one jitter parameter and said second clock signal.

12. The method of claim 1, wherein said input signal is PAM-n coded, wherein n is an integer larger than 1.

13. The method of claim 1, wherein said at least one jitter parameter is determined based on a mathematical model of said input signal.

14. A measurement instrument, comprising at least one input channel and an analysis circuit being connected to the at least one input channel,
   the measurement instrument being configured to receive an input signal via said input channel and to forward the input signal to the analysis circuit, wherein the input signal is associated with a first clock signal comprising at least one jitter component
   the analysis circuit being configured to recover a second clock signal based on said input signal;
   the analysis circuit being configured to determine at least one jitter parameter that is associated with said at least one jitter component;
   the analysis circuit being configured to reconstruct a jitter signal based on said at least one jitter parameter, wherein said jitter signal is associated with said at least one jitter component; and
   said analysis circuit being configured to determine a third clock signal based on said second clock signal and said jitter signal.

15. The measurement instrument of claim 14, wherein said analysis circuit comprises an analog-to-digital converter, said analog-to-digital converter being configured to digitize said input signal.

16. The measurement instrument of claim 14, wherein said analysis circuit is configured to determine at least one of a frequency of said at least one jitter component, a phase of said at least one jitter component and an amplitude of said at least one jitter component.

17. The measurement instrument of claim 14, wherein said analysis circuit is configured to determine said symbol sequence based on the input signal.

18. The measurement instrument of claim 17, wherein said analysis circuit is configured to determine a reconstructed input signal based on at least one of the determined symbol sequence and said input signal.

19. The measurement instrument of claim 14, wherein said analysis circuit is configured to determine a level difference between a reference level and at least one of said input signal and said reconstructed input signal.

20. The measurement instrument of claim 14, wherein said analysis circuit is configured to determine a response function of a signal source based on said third clock signal and said input signal.

* * * * *